US009611536B2

(12) United States Patent
Jin et al.

(10) Patent No.: US 9,611,536 B2
(45) Date of Patent: Apr. 4, 2017

(54) METHOD FOR MAKING NANOSTRUCTURES

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 91 days.

(21) Appl. No.: 14/549,567

(22) Filed: Nov. 21, 2014

(65) Prior Publication Data

US 2015/0145162 A1     May 28, 2015

(30) Foreign Application Priority Data

Nov. 27, 2013  (CN) .......................... 2013 1 0607739

(51) Int. Cl.
*C23C 14/00* (2006.01)
*C23C 14/58* (2006.01)
(Continued)

(52) U.S. Cl.
CPC ...... *C23C 14/0605* (2013.01); *C23C 14/0005* (2013.01); *C23C 14/5806* (2013.01);
(Continued)

(58) Field of Classification Search
CPC ............ C23C 14/0005; C23C 14/5806; C23C 14/5873; C23C 16/01; C23C 16/56
See application file for complete search history.

(56) References Cited

U.S. PATENT DOCUMENTS 8,455,336 B2  6/2013  Wei et al.
2010/0285300 A1*  11/2010  Wang ........................ B82B 1/00
                                                           428/315.5
(Continued)

FOREIGN PATENT DOCUMENTS

CN    101475135    7/2009
CN    102417176    4/2012
(Continued)

*Primary Examiner* — James M Mellott
(74) *Attorney, Agent, or Firm* — Zhigang Ma

(57) ABSTRACT

A method of making nanostructures includes following steps. A carbon nanotube structure is suspended, wherein the carbon nanotube structure includes a number of carbon nanotubes orderly aligned. A carbon nanotube composite structure is formed by applying a precoated layer on the carbon nanotube structure, wherein a thickness of the precoated layer on an outer surface of each of the number of carbon nanotubes ranges from about 2 nanometers to about 10 nanometers. The carbon nanotube composite structure is transferred on a substrate and treating the carbon nanotube composite structure with a solution. The carbon nanotube structure is removed by annealing the carbon nanotube composite structure in an annealing temperature from about 500° C. to about 700° C., wherein the precoated layer is softened and contracted.

20 Claims, 12 Drawing Sheets

(51) Int. Cl.
 C23C 16/01 (2006.01)
 C23C 16/56 (2006.01)
 C23C 14/06 (2006.01)
 H01L 33/42 (2010.01)
(52) U.S. Cl.
 CPC .......... *C23C 14/5873* (2013.01); *C23C 16/01* (2013.01); *C23C 16/56* (2013.01); *H01L 33/42* (2013.01); *H01L 2933/0091* (2013.01)

(56) References Cited

U.S. PATENT DOCUMENTS

2012/0174855 A1 7/2012 Wei et al.
2013/0196460 A1 8/2013 Dubrow et al.

FOREIGN PATENT DOCUMENTS

| CN | 102569588 | 7/2012 |
| TW | 201238886 | 10/2012 |
| TW | 201239949 | 10/2012 |

\* cited by examiner

METHOD FOR MAKING NANOSTRUCTURES

RELATED APPLICATIONS

This application claims all benefits accruing under 35 U.S.C. §119 from China Patent Application 201310607739.4, filed on Nov. 27, 2013 in the China Intellectual Property Office, the disclosure of which is incorporated herein by reference.

FIELD

The present disclosure relates to a method for making nanostructures.

BACKGROUND

At present, microstructures are often required in the semiconductor devices. The method of making the microstructures mainly includes electron beam lithography method, or plasma etching method. However, these methods require large equipment and instruments, and the process are too complex, the fabricate time is too long, and the size of microstructures is difficult to achieve nanoscale dimension.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout several views.

DETAILED DESCRIPTION

Figure 1:
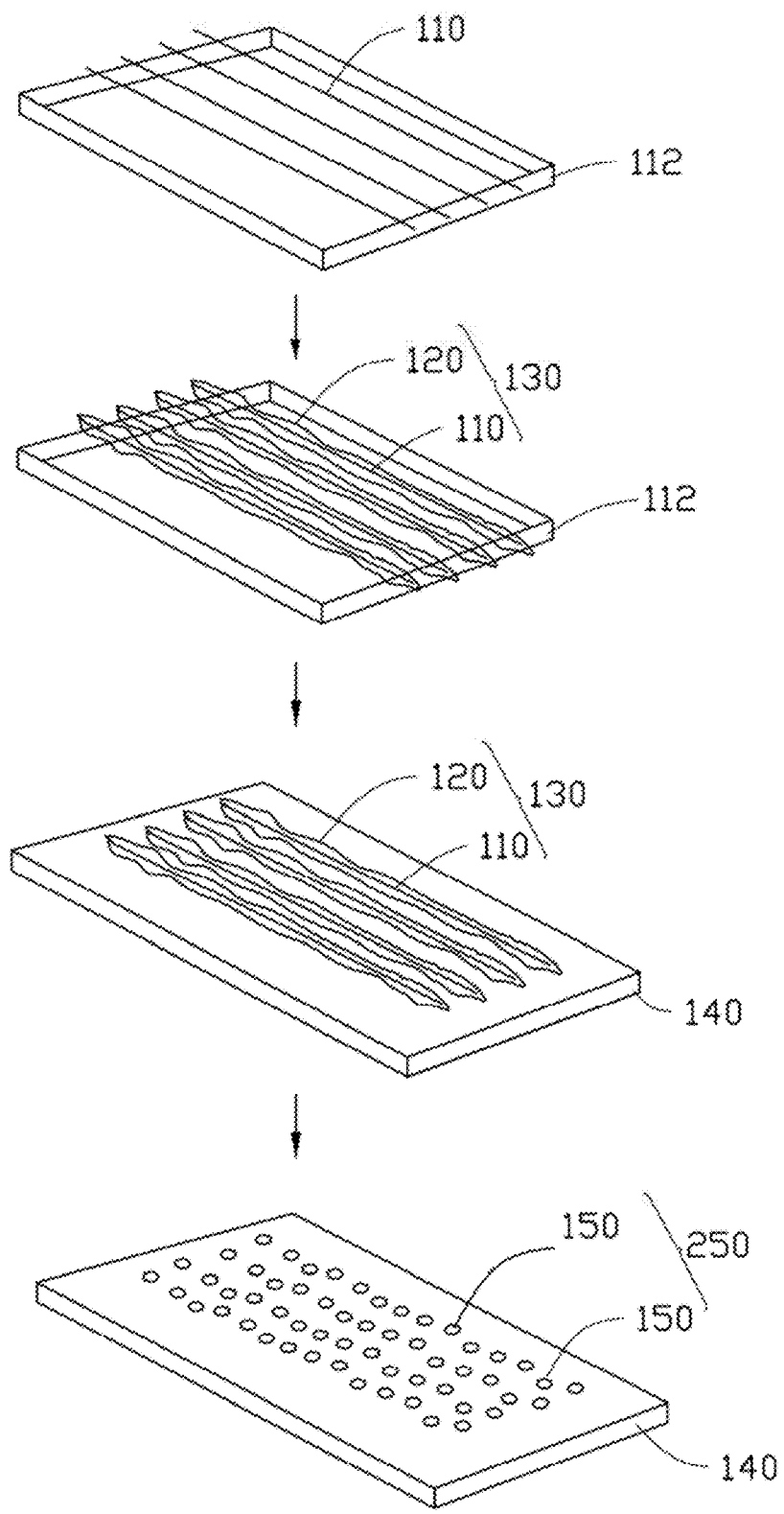
FIG. 1 is a flow chart of one embodiment of a method for fabricating nanostructures.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

FIG. 1 illustrates that a method of one embodiment for fabricating a plurality of nanostructures 150 includes:

(S10) suspending a carbon nanotube structure 110, wherein the carbon nanotube structure 110 comprises a plurality of carbon nanotubes orderly aligned;

(S20) forming a carbon nanotube composite structure 130 by applying a precoated layer 120 on the carbon nanotube structure 110, wherein a thickness of the precoated layer 120 on an outer surface of each of the plurality of carbon nanotubes ranges from about 2 nanometers to about 10 nanometers;

(S30) transferring the carbon nanotube composite structure 130 on a substrate 140 and treating the carbon nanotube composite structure 130 with a solution;

(S40) removing the carbon nanotube structure 110 by annealing the carbon nanotube composite structure 130 in a annealing temperature from about 500° C. to about 700° C., wherein the precoated layer 120 is softened and contracted.

In step (S10), the plurality carbon nanotubes can be single-walled, double-walled, or multi-walled carbon nanotubes. A diameter of each single-walled carbon nanotube ranges from about 0.5 nanometers (nm) to about 50 nm. A diameter of each double-walled carbon nanotube ranges from about 1 nm to about 50 nm. A diameter of each multi-walled carbon nanotube ranges from about 1.5 nm to about 50 nm. The length of each carbon nanotube is greater than 50 micrometers (μm). In one embodiment, the length of the carbon nanotubes ranges from about 200 μm to 900 μm.

The carbon nanotube structure 110 can include at least one carbon nanotube film, at least one carbon nanotube wire, or a combination thereof. The carbon nanotube structure 110 includes a plurality of carbon nanotubes. In one embodiment, the carbon nanotube structure 110 can be a substantially pure structure of the carbon nanotubes, without impurities and chemical functional groups. The extending direction of the carbon nanotubes is parallel with the surface of the carbon nanotube structure 110. When the carbon nanotube structure 110 is located on the surface of the substrate 140, the extending direction of the carbon nanotubes is parallel with the surface of the substrate 140. The carbon nanotube structure 110 can be a continuous film or a wire. The carbon nanotubes can be oriented along one or more preferred orientations. The preferred orientation means that a large majority of the carbon nanotubes in the carbon nanotube structure 110 are arranged substantially along the same direction.

Figure 2:
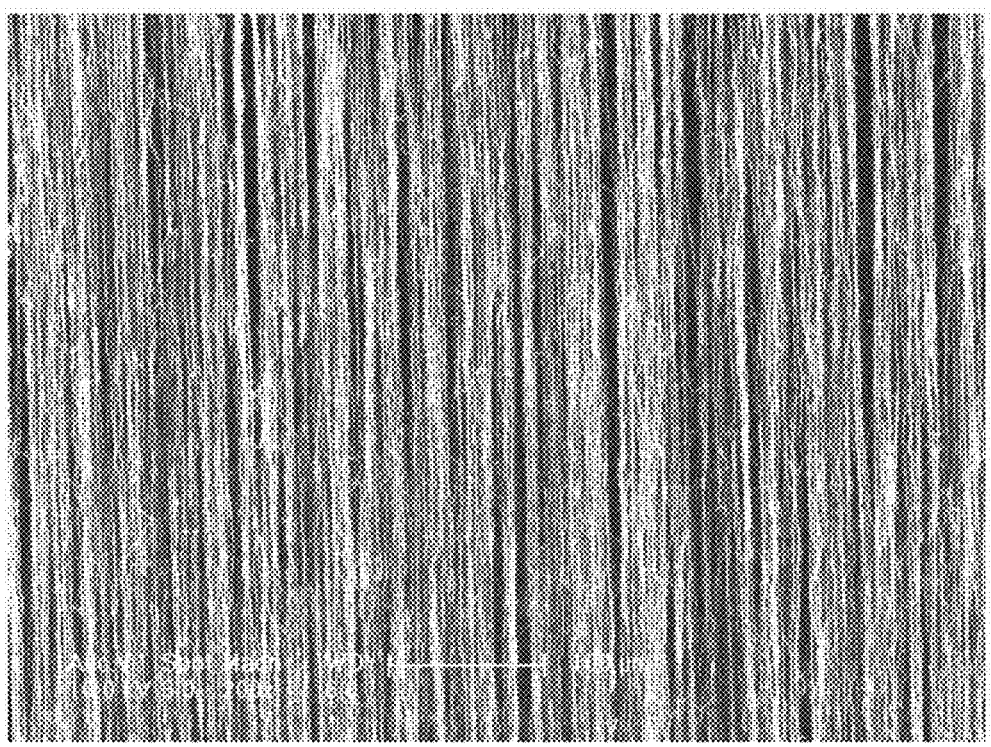
FIG. 2 shows a Scanning Electron Microscope (SEM) image of one embodiment of a carbon nanotube film.

FIG. 2 illustrates that in one embodiment, the carbon nanotube structure 110 includes at least one drawn carbon nanotube film. A drawn carbon nanotube film can be drawn from a carbon nanotube array that is able to have a drawn film. The drawn carbon nanotube film includes a plurality of successive and oriented carbon nanotubes joined end-to-end by van der Waals force. The drawn carbon nanotube film is a free-standing film. Each drawn carbon nanotube film includes a plurality of successively oriented carbon nanotube segments joined end-to-end by van der Waals force. Each carbon nanotube segment includes a plurality of carbon nanotubes parallel to each other, and combined by van der Waals force. Some variations can occur in the drawn carbon nanotube film. The carbon nanotubes in the drawn carbon nanotube film are oriented along a preferred orientation. Furthermore, the plurality of carbon nanotubes is substantially aligned along a plurality of straight lines. The plurality of straight lines is spaced from and substantially parallel with each other. Along each of the plurality straight lines, the plurality of carbon nanotubes are joined end to end by van der Waals force. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nm to about 100 μm.

The carbon nanotube structure 110 can include at least two stacked drawn carbon nanotube films. In other embodiments, the carbon nanotube structure 110 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film); an angle can exist between the orientation of carbon nanotubes in adjacent films, whether stacked or adjacent. Adjacent carbon nanotube films can be combined by only the van der Waals force. An angle between the aligned directions of the carbon nanotubes in two adjacent carbon nanotube films can range from about 0 degrees to about 90 degrees. When the angle between the aligned directions of the carbon nanotubes is 0 degrees, the two carbon nanotube films can be defined as oriented with the same preferred direction. When the angle between the aligned directions of the carbon nanotubes is greater than 0 degrees and smaller than 90 degrees or equal to 90 degrees, the two carbon nanotube films can be defined as entangled with each other. Stacking the carbon nanotube films will also add to the structural integrity of the carbon nanotube structure 110.

Figure 3:
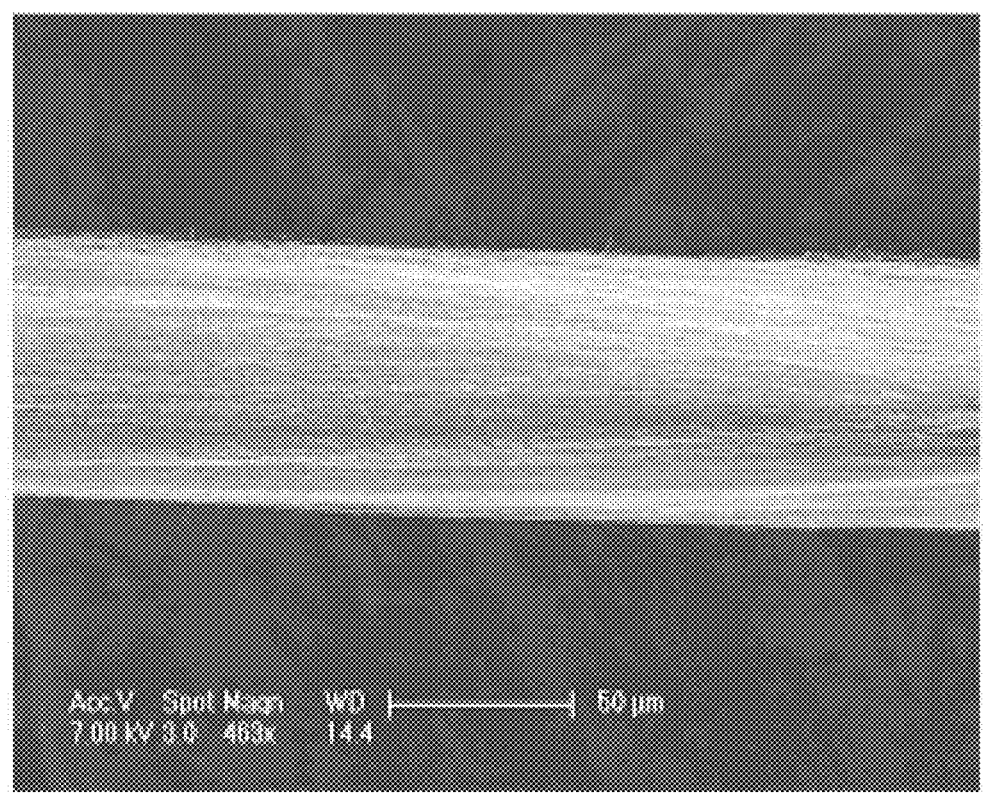
FIG. 3 shows a SEM image of one embodiment of an untwisted carbon nanotube wire.

The carbon nanotube wire can be untwisted or twisted. Treating the drawn carbon nanotube film with a volatile organic solvent can form the untwisted carbon nanotube wire. In the embodiment, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes. Thus, the drawn carbon nanotube film will be shrunk into untwisted carbon nanotube wire. FIG. 3 illustrates that the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. In one embodiment, the untwisted carbon nanotube wire includes a plurality of successive carbon nanotube segments joined end to end by van der Waals force. Each carbon nanotube segment includes a plurality of carbon nanotubes substantially parallel to each other, and combined by van der Waals force. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

Figure 4:
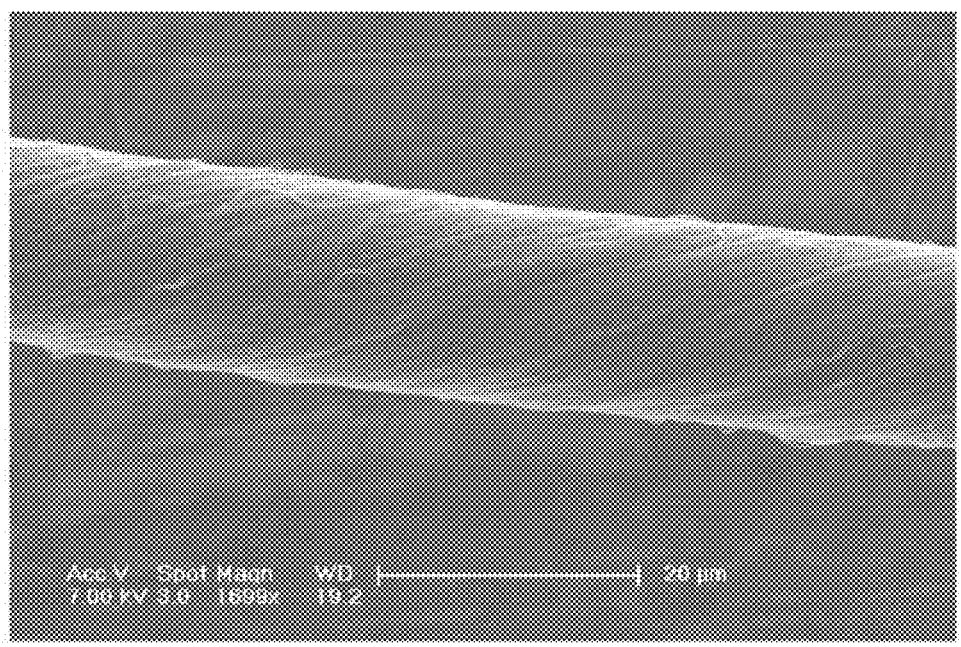
FIG. 4 shows a SEM image of one embodiment of a twisted carbon nanotube wire.

The twisted carbon nanotube wire can be formed by twisting a drawn carbon nanotube film using a mechanical force to turn the two ends of the drawn carbon nanotube film in opposite directions. FIG. 4 illustrates that the twisted carbon nanotube wire includes a plurality of carbon nanotubes helically oriented around an axial direction of the twisted carbon nanotube wire. In one embodiment, the twisted carbon nanotube wire includes a plurality of successive carbon nanotube segments joined end to end by van der Waals force. Each carbon nanotube segment includes a plurality of carbon nanotubes parallel to each other, and combined by van der Waals force. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

The carbon nanotube structure 110 can be suspended by fixing the carbon nanotube structure 110 on a frame 112. The carbon nanotube structure 110 can include a first portion and a second portion inside the first portion. The first portion is fixed on the frame 112, and the second portion is suspended. Thus, two opposite surfaces of the carbon nanotube structure 110 in the second portion can be exposed. In one embodiment, the frame 112 can be in a shape of rectangle. The frame 112 can also be a metal mesh to suspend the carbon nanotube structure 110.

In step (S20), the precoated layer 120 can be deposited on the carbon nanotube structure 110 by electron beam vapor deposition. The deposition method can also be an atomic layer deposition method, or a physical vapor deposition method, as long as the morphology and structure of the carbon nanotube structure 110 cannot be damaged during the deposition process of the precoated layer 120.

The carbon nanotube structure 110 has two opposite surfaces. Because the carbon nanotube structure 110 is suspended, thus two opposite surfaces of the carbon nanotube structure will be coated with the precoated layer 120. In one embodiment, the plurality of carbon nanotubes in the carbon nanotube structure 110 will be coated by the precoated layer 120. Furthermore, the carbon nanotube structure 110 defines a plurality of micropores, thus the precoated layer 120 can also be deposited into the micropores. The carbon nanotube structure 110 will be closely integrated with the precoated layer 120 to form an integrated carbon nanotube composite structure 130. The carbon nanotube structure 110 is used as a supporter to support the precoated layer 120. In one embodiment, an outer surface of each of the plurality of the carbon nanotubes in the carbon nanotube structure 110 is completely covered by the precoated layer 120.

A material of the precoated layer 120 can be metal, metal oxide, metal sulfides, or nonmetallic oxides. The metal can be gold, silver, nickel, titanium, iron, aluminum, platinum, palladium, chromium, molybdenum, tungsten, or copper. The metal oxide can be aluminum oxide, magnesium oxide, zinc oxide, hafnium oxide, or other metal oxide. The nonmetallic oxides can be silica. The material of the precoated layer 120 can be deposited on the surface, not oxidized by air, and can be softened and shrunk in the subsequent annealing process. A thickness of the precoated layer 120 can range from about 2 nanometers to about 10 nanometers. In one embodiment, the thickness of the precoated layer 120 can range from about 2 nanometers to about 10 nanometers. Therefore, the precoated layer 120 can be uniformly coated on the carbon nanotubes, and the precoated layer 120 can be uniformly and completely softened and contracted in subsequent annealing process.

In one embodiment, the precoated layer 120 is deposited on the surface of the carbon nanotube structure 110 by electron beam vapor deposition, the material of the precoated layer 120 is copper, and the thickness of the precoated layer 120 is 2 nanometers.

In step (S30), the carbon nanotube composite structure 130 and the frame 112 can be transferred to the substrate 140, and then the frame 112 can be separated and removed. Because the carbon nanotube composite structure 130 is not completely attached on the substrate 140, air will exist between the carbon nanotube composite structure 130 and the substrate 140.

When the carbon nanotube composite structure 130 is treated with the solution, the solution can be dripped on the carbon nanotube structure 130 to soften the carbon nanotubes structure 130 and draw off the gas existing between the carbon nanotube composite structure 130 and the substrate 140. After the solution is evaporated, the carbon nanotube composite structure 130 will be tightly attached on the substrate 140, thus the plurality of nanostructures 150 can be tightly fixed on the substrate 140 in the subsequence process.

The solvent can be water, or organic solvent. The organic solvent can be a volatile organic solvent, such as ethanol, methanol, acetone, dichloroethane, or chloroform. In one embodiment, the solvent is ethanol. The ethanol is dripped on the carbon nanotube composite structure 130 and penetrates the carbon nanotube composite structure 130. The carbon nanotube composite structure 130 can be closely attached to the substrate 140 via drying.

The substrate 140 can be an insulating substrate, a conductive substrate such as metal substrate, or a semiconductor substrate, as long as the substrate 140 will not react with the precoated layer 120 in the annealing process, and a physical or chemical changes will not occur in the substrate 140 under the temperature in a range from about 500° C. to 700° C. In one embodiment, the substrate 140 is a silicon substrate.

In step (S40), the carbon nanotube composite structure 130 can be annealed in the air. After the annealing process, the carbon nanotubes in the carbon nanotube composite structure 130 will be reacted with the oxygen under annealing temperature. Thus the carbon nanotube structure 110 can be removed from the carbon nanotube composite structure.

Furthermore, the precoated layer 120 can be softened under the annealing temperature. The term "soften" means that because the thickness of the precoated layer 120 is thinner, thus the precoated layer 120 can absorb the heat and can be transformed from a solid state to a molten liquid state. At the same time, because the carbon nanotube structure 110 is removed from the carbon nanotube composite structure 130, the softened precoated layer 120 will be shrunk and contracted according to the minimum energy principle. Therefore, the plurality of nanostructures 150 will be formed on the substrate 140. Furthermore, the plurality of nanostructures 150 are integrated with the substrate 140 to form an integrated structure via van der Waals force.

Because the preformed layer 120 is deposited on the surface of the plurality of carbon nanotubes, thus the adjacent nanostructures 150 will be aligned along one of the carbon nanotubes. The plurality of nanostructures 150 are spaced from each other and aligned along the plurality of carbon nanotubes or straight lines parallel with each other.

In one embodiment, the carbon nanotube structure 110 is a drawn carbon nanotube film or a plurality of carbon nanotube wires aligned along the same direction. Because the plurality of carbon nanotubes in the drawn carbon nanotube film and the carbon nanotube wires are substantially oriented along the same direction, thus the plurality of nanostructure 150 are aligned along the plurality of carbon nanotubes in the same straight.

In one embodiment, the carbon nanotube structure 110 comprises two drawn carbon nanotube films intersected with each other, thus the plurality of nanostructures 150 can be spaced from each other and aligned along different directions. Furthermore, a first portion of the plurality of nanostructures 150 are aligned along a first direction, and a second portion of the plurality of nanostructures 150 are aligned along the second direction, and the first direction can be perpendicular with the second direction.

The annealing temperature should be selected according to the oxidation temperature of the carbon nanotube structure 110 and the deformation temperature of the substrate 140. The annealing temperature should be higher than the oxidation temperature and lower than the deformation temperature. Thus the carbon nanotubes in the carbon nanotube structure 110 can be completely removed, and the precoated layer 120 can be softened.

In one embodiment, the material of the precoated layer 120 can be metal such as gold, silver, titanium, or nickel, the annealing temperature can range from about 500° C. to about 700° C., and the annealing temperature can range from about 5 minutes to about 60 minutes. Because the precoated layer 120 is thin, the precoated layer 120 will be softened and contracted into a plurality of spherical nanostructures.

The thinner the precoated layer 120, the higher the annealing temperature, and the shorter the annealing time, the smaller the size of the nanostructure 150 and the bigger the distance between two adjacent nanostructure 150 will be.

The plurality of nanostructures 150 are spherical. The size of each of the plurality of nanostructures 150 ranges from about 10 nanometers to about 300 nanometers. In one embodiment, the size of each of the plurality of nanostructures 150 can range from about 20 nanometers to 100 nanometers. The distance between adjacent two nanostructures 150 along the extending direction of the carbon nanotube can range from about 10 nanometers to about 300 nanometers, such as 20 nanometers, or 100 nanometers. A height of nanostructures 150 measured from the substrate 140 can range from about 30 nanometers to 50 nanometers.

Figure 5:
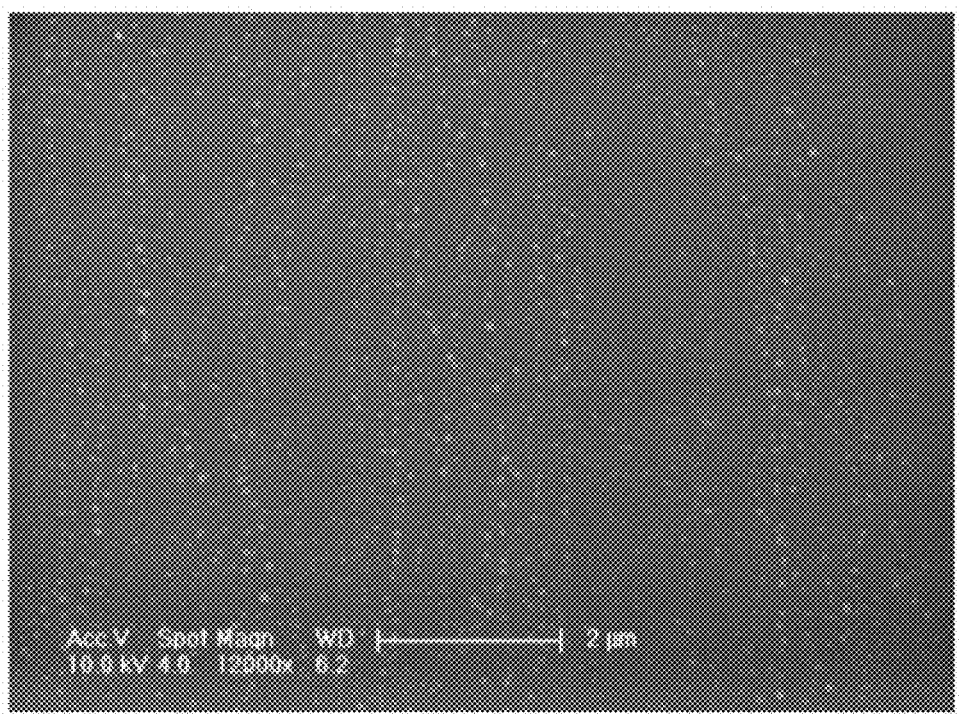
FIGS. 5-6 show SEM images of one embodiment of nanostructures.
Figure 6:
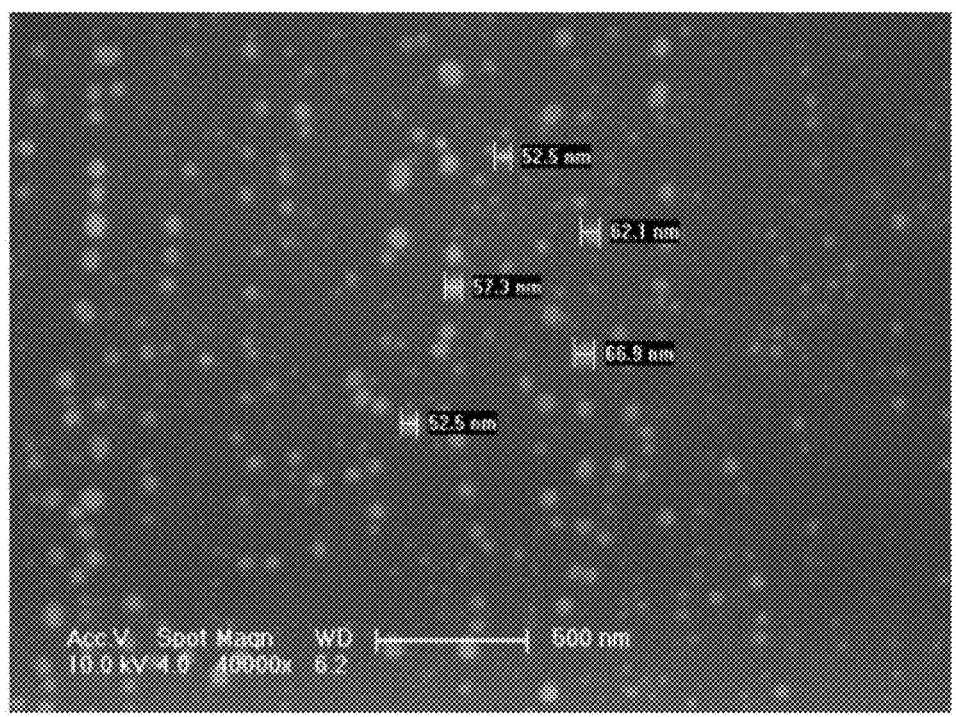

FIGS. 5-6, illustrate that in one embodiment, the annealing temperature is about 600° C., and annealing time is about 30 minutes. The plurality of nanostructure 150 are distributed and spaced from each other on the substrate 140.

The method of making nanostructures 150 has following advantages. The carbon nanotube structure 110 comprises the plurality of oriented carbon nanotubes, and the precoated layer 120 is coated on the plurality of oriented carbon nanotubes, thus the precoated layer 120 will be transferred into the plurality of nanostructures 150 uniformly aligned along each of the plurality of oriented carbon nanotubes. Because the plurality of carbon nanotubes can be parallel with each other, the plurality of nanostructures 150 are substantially aligned along a plurality of straight lines spaced from and substantially parallel with each other. Furthermore, the plurality of nanostructures 150 are directly and firmly attached on the substrate 140 via van der Waals force to form an integrated structure, thus the plurality of nanostructures 150 can be convenient for industrial application. The method of making nanostructures 150 is simple, highly efficient, and easy to industrialize.

Furthermore, the plurality of nanostructures 150 forms a nanostructure layer 250 on the substrate 140. The nanostructure layer 250 comprises the plurality of nanostructures 150 spaced from each other and substantially aligned along a plurality of straight lines spaced from each other. The plurality of nanostructures 150 are spherical particles. The size of each of the plurality of nanostructures 150 range from about 10 nanometers to about 300 nanometers, such as 20 nanometers, 100 nanometers. The distance between adjacent two nanostructures 150 ranges from about 10 nanometers to about 300 nanometers, such as 20 nanometers or 100 nanometers. In one embodiment, the size of each of the plurality of nanostructures 150 ranges from about 20 nanometers to about 100 nanometers. The distance between adjacent two nanostructures 150 ranges from about 20 nanometers to about 200 nanometers. The nanostructure layer 250 can be firmly attached on the substrate 140 via van der Waals force.

Figure 7:
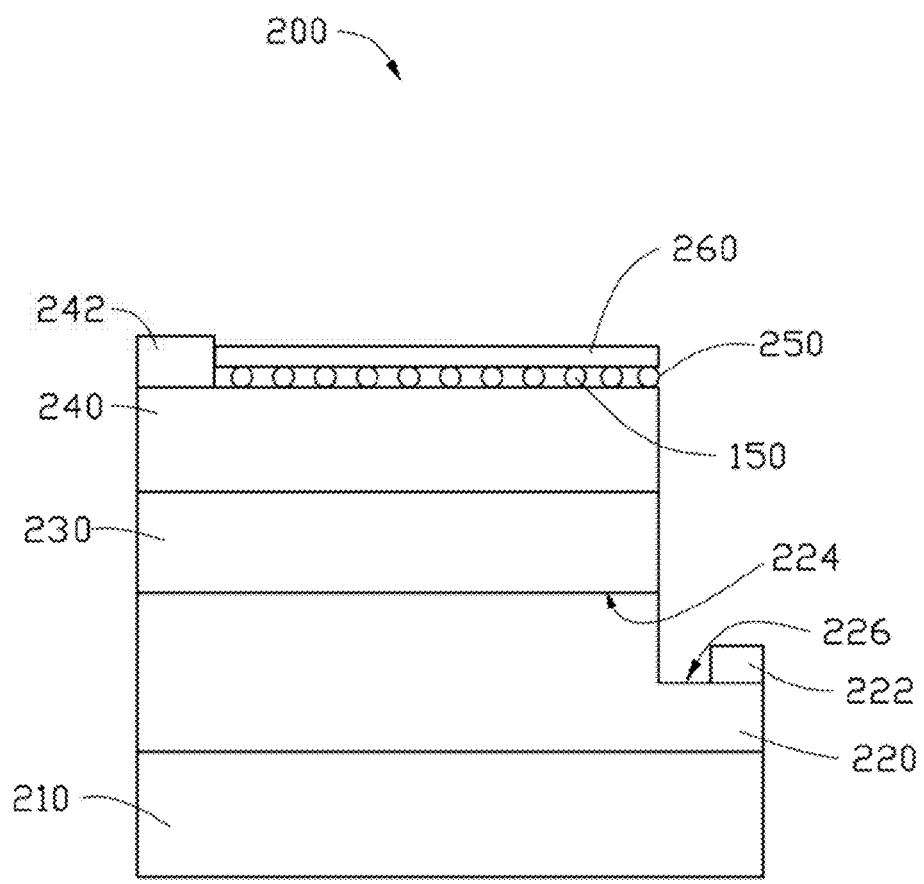
FIG. 7 is a schematic view of one embodiment of light emitting diode.

FIG. 7 illustrates that one embodiment of a light emitting diode (LED) 200 comprises a substrate 210, a first semiconductor layer 220, an active layer 230, a second semiconductor layer 240, a first electrode 222, a second electrode 242, a nanostructure layer 250, and a transparent conductive layer 260. The first semiconductor layer 220, the active layer 230, and the second semiconductor layer 240 stacked on the substrate 210 in that order. The first electrode 222 is electrically connected to the first semiconductor layer 220. The nanostructure layer 250 is located on a surface of the second semiconductor layer 240 away from the substrate 210. The second electrode 242 is electrically connected to the second semiconductor layer 240. The transparent conductive layer 260 is located on the nanostructure layer 250 and electrically connected to the second electrode 242.

The substrate 210 can be made of a transparent material and adapted to support the first semiconductor layer 220. A shape or a size of the substrate 210 is determined according to need. The material of the substrate 210 can be GaAs, GaN, AlN, Si, SOI, SiC, MgO, ZnO, LiGaO$_2$, LiAlO$_2$, or Al$_2$O$_3$. The size, thickness, and shape of the substrate 210 can be selected according to need. In one embodiment, the substrate 210 is a sapphire substrate.

The first semiconductor layer 220 is located on a surface of the substrate 210. The first semiconductor layer 220 comprises a first region 224 to support the active layer 230 and a second region 226 to locate first electrode 222. The active layer 230 and the second semiconductor layer 240 are stacked on the first region 224. The first electrode 222 is located on the second region 226. The first semiconductor layer 220 can be an N-type semiconductor or a P-type semiconductor. The material of the N-type semiconductor can include N-type gallium nitride, N-type gallium arsenide, or N-type copper phosphate. The material of the P-type semiconductor can include P-type gallium nitride, P-type gallium arsenide, or P-type copper phosphate. The N-type semiconductor is configured to provide photons, and the P-type semiconductor is configured to provide holes. The thickness of the first semiconductor layer 220 ranges from about 1 μm to about 5 μm. In one embodiment, the first semiconductor layer 220 is an N-type gallium nitride doped with Si.

The active layer 230 and the second semiconductor layer 240 are stacked on the first region 224 in that order. The active layer 230 can cover the entire surface of the first region 224. The active layer 230 is a photon excitation layer and can be one of a single layer quantum well film or multilayer quantum well films. The active layer 230 is made of GaInN, AlGaInN, GaSn, AlGaSn, GaInP, or GaInSn. In one embodiment, the active layer 230 has a thickness of about 0.3 μm and includes one layer of GaInN and another layer of GaN. The GaInN layer is stacked with the GaN layer.

The second semiconductor layer 240 is located on the active layer 230. In one embodiment, the second semiconductor layer 240 covers the entire surface of the active layer 230. The thickness of the second semiconductor layer 240 ranges from about 0.1 μm to about 3 μm. The second semiconductor layer 240 can be an N-type semiconductor layer or a P-type semiconductor layer. Furthermore, the type of the second semiconductor layer 240 is different from the type of the first semiconductor layer 220. A surface of the second semiconductor layer 240 is used as a light emitting surface of the LED 200. In one embodiment the second semiconductor layer 240 is a P-type gallium nitride doped with Mg.

The nanostructure layer 250 is located on the second semiconductor layer 240 and sandwiched between the transparent layer 260 and the second semiconductor layer 240. A surface of the semiconductor layer 240 away from the substrate 210 can define a third region and a fourth region. The nanostructure layer 250 can cover the third region. The fourth region is used to locate the second electrode 242. The nanostructure layer 250 comprises the plurality of nanostructures 150 spaced from each other.

The transparent layer 260 can cover the nanostructure layer 250 and the second electrode 242. The transparent layer 260 can be a multi-layer structure to electrically connect the second electrode 242 to spread the current. In one embodiment, the transparent layer 260 can be a two-layer structure consisting of a Ti layer with about 15 nm in thickness and an Au layer with about 100 nm in thickness.

The first electrode 222 is electrically connected with the first semiconductor layer 220 and spaced from the active layer 230. The first electrode 222 covers at least part of the surface of the second region 226. The first electrode 222 is a single layer structure or a multi-layer structure. The first electrode 222 can be an N-type electrode or a P-type electrode according the first semiconductor layer 220. The material of the first electrode 222 can be selected from Ti, Ag, Al, Ni, Au, or any combination of them. The material of the first electrode 222 can also be indium-tin oxide (ITO) or carbon nanotube film. In one embodiment, the first electrode 222 is a two-layer structure consisted of a Ti layer with about 15 nm in thickness and an Au layer with about 100 nm in thickness.

The second electrode 242 can be an N-type electrode or P-type electrode. The type of the second electrode 242 is the same as the second semiconductor layer 240. The shape of the second electrode 242 is arbitrary and can be selected according to need. The material of the second electrode 242 can be Ti, Ag, Al, Ni, Au or any combination of them. The second electrode 242 can be located on the fourth region.

Figure 8:
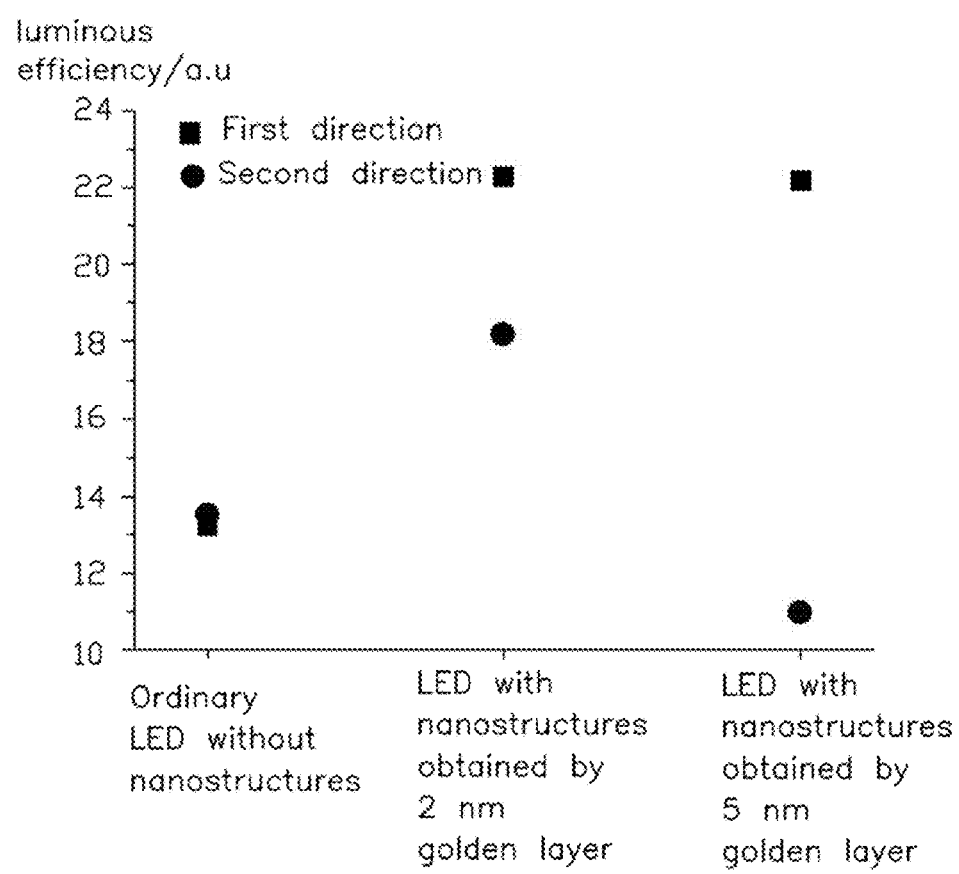
FIG. 8 shows a comparison chart of light emission efficiency between light emitting diode with different nanostructures and without nanostructures.

Because the nanostructure layer 250 comprises the plurality of nanostructures 150 substantially aligned along the plurality of straight lines, thus the nanostructure layer 250 has an optical polarization effect. FIG. 8 illustrates that the plurality of nanostructures 150 are defined as aligned along a first direction, and a second direction is defined as a direction perpendicular to the first direction. Thus at least a portion of the light from the LED 200 is polarized. Furthermore, while the plurality of nanostructures 150 are obtained by depositing a golden layer with a thickness of about 5 nanometers, nearly all the light from the LED 200 are polarized.

Furthermore, when the photons reach the nanostructure layer 250 with a large incident angle, the plurality of nanostructures 150 can change the motion direction of the photons, so that these photons can be extracted from the light emitting surface. Thus the light emitting from the LED 200 can be polarized and the light extraction efficiency of the LED 200 will be improved.

Figure 9:
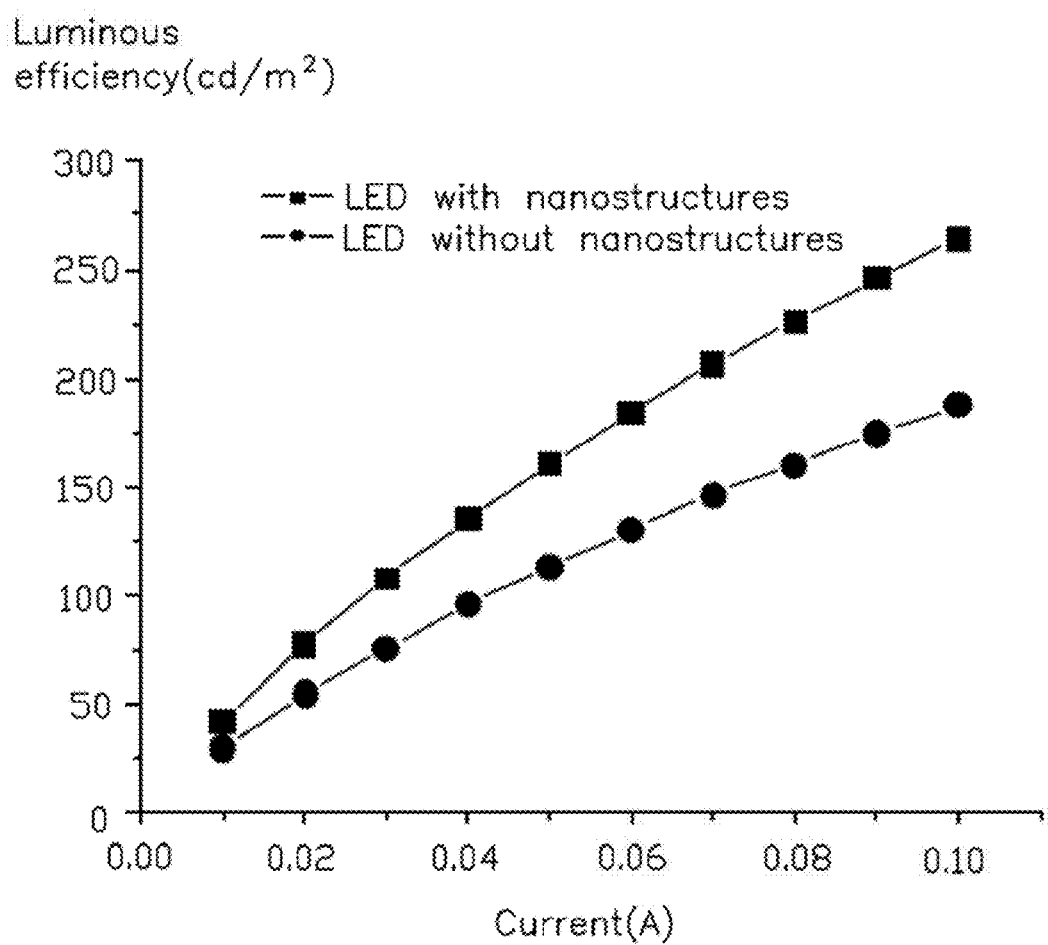
FIG. 9 shows a comparison chart of light emission efficiency between the light emitting diode in FIG. 7 and the conventional light emitting diode without nanostructures.
Figure 10:
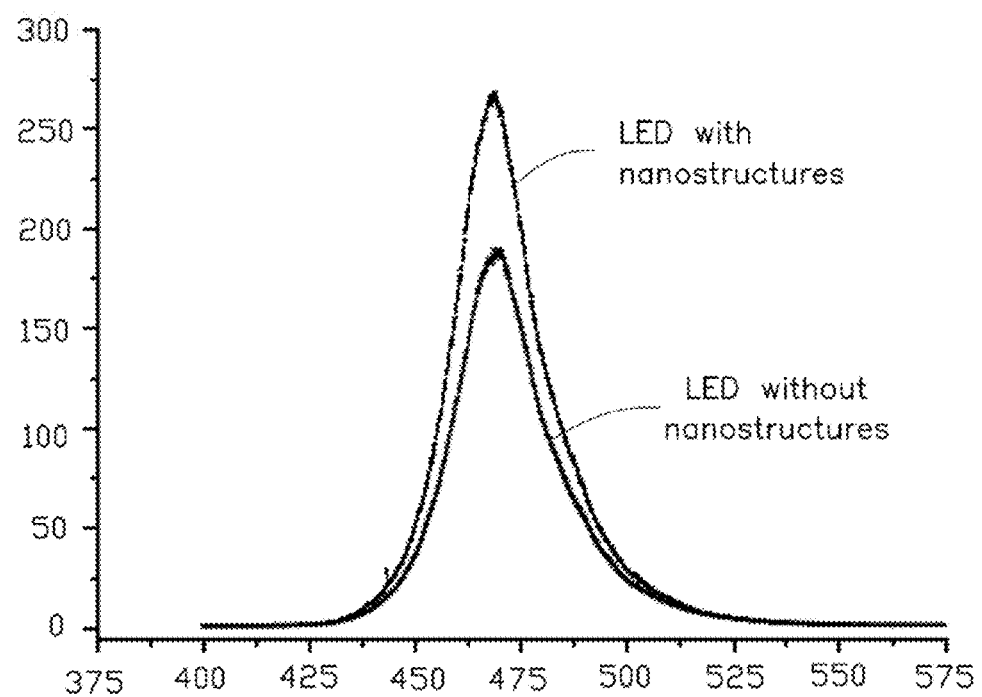
FIG. 10 shows a comparison chart of luminous efficiency curve under an excitation current of 0.1 A between the light emitting diode in FIG. 7 and conventional light emitting diode.

FIG. 9 illustrates that the luminous efficiency of the LED 200 is much higher that the ordinary light emitting diode without the nanostructure layer 250. FIG. 10 illustrates when the LED 200 is exited under the excitation current 0.1 A, the luminous efficiency of the LED 200 is improved by about 40% compared to the ordinary light emitting diodes without the nanostructure layer 250.

A method of the other embodiment for fabricating a plurality of nanostructures 151 includes:

(S11) suspending a carbon nanotube structure 110, wherein the carbon nanotube structure 110 comprises a plurality of carbon nanotubes orderly aligned;

(S21) forming a carbon nanotube composite structure 130 by applying a first precoated layer and a second precoated layer on the carbon nanotube composite structure 130 in that sequence, wherein a total thickness of the first precoated layer and the second precoated layer on outer surface of each of plurality of carbon nanotubes ranges from about 2 nanometers to about 10 nanometers;

(S31) transferring the carbon nanotube composite structure 130 to a substrate 140 and treating the carbon nanotube composite structure 130 with a solution;

(S41) removing the carbon nanotube structure 110 by annealing the carbon nanotube composite structure 130 in a annealing temperature from about 500° C. to about 700° C., wherein both the first precoated layer and the second precoated layer are softened and contracted.

The method of making the plurality of nanostructure 151 is similar to the method of making the plurality of nanostructures 150, except that the first precoated layer and the second precoated layer are coated on the carbon nanotube structure 110.

In step (S21), the first precoated layer is deposited on the surface of the carbon nanotube layer 110, and the second precoated layer is coated on the first precoated layer. Both the first precoated layer and the second precoated layer are continuously layered structures. The first precoated layer is sandwiched between the carbon nanotube layer 110 and the second precoated layer.

The material of the first precoated layer can be different from the material of the second precoated layer. The total thickness of the first precoated layer and the second precoated layer can range from about 2 nanometers to about 5 nanometers. In one embodiment, the first precoated layer is silver with a thickness of about 2 nanometers, and the second precoated layer is silicon with a thickness of about 2 nanometers.

Figure 11:
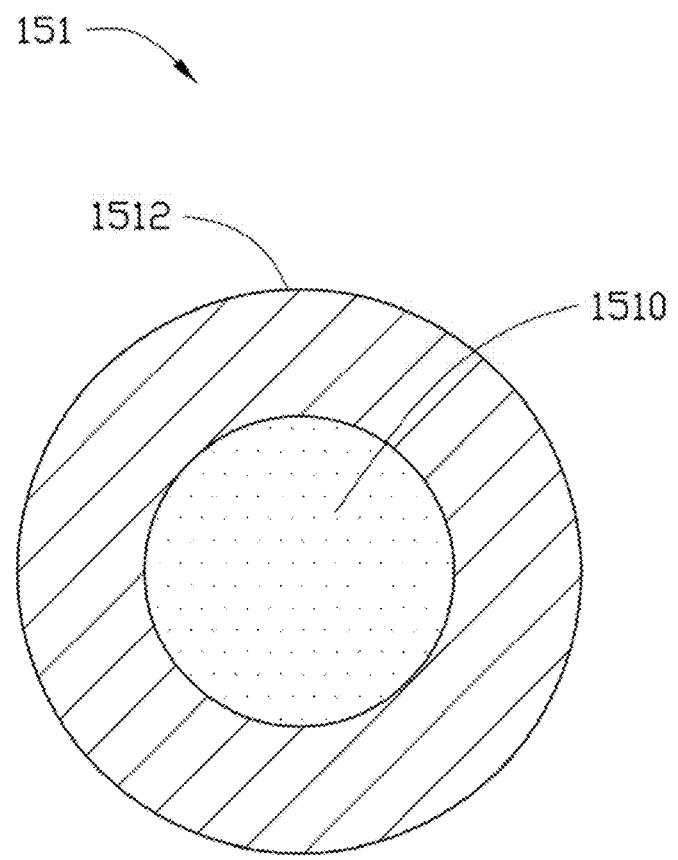
FIG. 11 is a schematic view of another embodiment of nanostructures.

FIG. 11 illustrates that each of the plurality of nanostructures 151 comprises a core 1510 and a shell 1512 coated on the core 1510. The shell 1512 is directly coated on the core 1510 to form an integrated spherical particle. The core 1510 is completely surrounded by the shell 1512. The core 1510 is obtained from the contraction of the first precoated layer, and the shell 1512 is obtained from the contraction of the second precoated layer. The shell 1512 can protect the core 1510 from oxidation during the annealing process.

Figure 12:
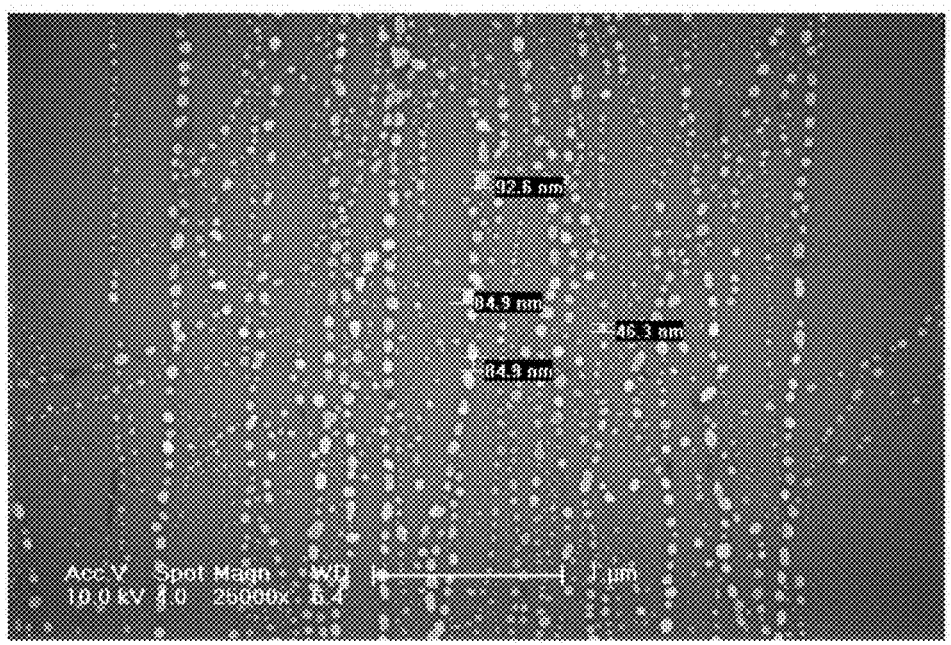
FIG. 12 shows a SEM image of the nanostructures in FIG. 11.

In one embodiment, the annealing temperature is about 600° C., and the annealing time is about 30 minutes. FIG. 12 illustrates that the plurality of nanostructures 151 are uniformly dispersed and spaced from each other. A size of the each of the plurality of nanostructures 151 ranges from about 10 nanometers to about 100 nanometers, such as 40 nanometers. A distance between adjacent two nanostructures 151 is about 20 nanometers to about 100 nanometers, such as 50 nanometers.

A dielectric constant $\in_0$ of the nanostructure 151 is between a dielectric constant $\in_1$ of the first precoated layer and a dielectric constant $\in_2$ of the second precoated layer. Thus the dielectric constant of the nanostructures 151 can be adjusted by selecting the material of the first precoated layer and the second precoated layer. While the material of the core 1510 is metal, and the material of the shell 1512 is dielectric material, the plurality of nanostructures 151 can be applied to waveguide transmission. The surface plasma can be stably transmitted along the interface between the core 1510 and the shell 1512. The optical signal being absorbed by the metal can be avoided, the optical signal attenuation can be avoided, and the transmission distance is prolonged.

FIGS. 11-12 illustrate that the plurality of nanostructures 151 form a nanostructure layer. The plurality of nanostructures 151 are aligned along a plurality of straight lines spaced from and substantially parallel with each other. The plurality of nanostructures 151 can be combined with a substrate (not shown) via van der Waals force to form an integrated structure.

The method of making plurality of nanostructures 151 has following advantages. The plurality of nanostructures 151 are obtained by depositing a first precoated layer and a second precoated layer on the carbon nanotube layer 110, and the plurality of nanostructures 151 can be aligned along the plurality of carbon nanotubes in the carbon nanotube layer 110 after annealing process. Each of the plurality of nanostructures 151 comprises the core 1510 and shell 1512. The method of making plurality of nanostructures 151 is simple and low in cost.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method of making nanostructures, the method comprising:
suspending a carbon nanotube structure, wherein the carbon nanotube structure comprises a plurality of carbon nanotubes orderly aligned;
forming a carbon nanotube composite structure by applying a precoat layer on the carbon nanotube structure, wherein a thickness of the precoat layer on an outer surface of each of the plurality of carbon nanotubes ranges from 2 nanometers to 10 nanometers;
transferring the carbon nanotube composite structure on a surface of a substrate and treating the carbon nanotube composite structure with a solution by applying the solution on the carbon nanotube composite structure and evaporating the solution on the carbon nanotube composite structure so that the carbon nanotube composite structure is attached on the surface of the substrate; and
removing the carbon nanotube structure by annealing the carbon nanotube composite structure in an annealing temperature from 500° C. to 700° C., wherein the precoat layer is softened and contracted to form a plurality of nanostructures integrated with the substrate to form an integrated structure via van der Waals force.

2. The method of claim 1, wherein the carbon nanotube structure is a free-standing structure and the plurality of carbon nanotubes are joined end-to-end by van der Waals attractive force therebetween.

3. The method of claim 2, wherein the carbon nanotube structure comprises a carbon nanotube film, and the plurality of carbon nanotubes are substantially aligned along the same direction and parallel with a surface of the carbon nanotube film.

4. The method of claim 1, wherein the plurality of carbon nanotubes are aligned along a plurality of straight lines, and the plurality of straight lines are spaced from and parallel with each other.

5. The method of claim 4, wherein the plurality carbon nanotubes aligned along each of the plurality of straight line are joined end to end by van der Waals force.

6. The method of claim 1, wherein applying a precoat layer on the carbon nanotube structure comprises coating two opposite surfaces of the carbon nanotube structure with the precoat layer.

7. The method of claim 1, wherein the carbon nanotube structure defines a plurality of micropores, and the precoat layer is deposited into the carbon nanotube structure through the plurality of micropores.

8. The method of claim 1, wherein a material of the precoat layer is selected from a group consisting of metal, metal oxide, metal sulfides, and nonmetallic oxides.

9. The method of claim 1, wherein the precoat layer is annealed in air, and the carbon nanotube structure is reacted with oxygen of the air under the annealing temperature.

10. The method of claim 1, wherein the carbon nanotube structure is suspended by fixing the carbon nanotube structure on a frame, and the carbon nanotube structure comprises a first portion fixed on the frame and a second portion suspended.

11. The method of claim 1, wherein the applying the solution on the carbon nanotube composite structure comprises dripping the solution on the carbon nanotube composite structure.

12. The method of claim 1, wherein the solution is selected from a group consisting of water, ethanol, methanol, acetone, dichloroethane, and chloroform.

13. The method of claim 1, wherein the nanostructures are aligned along a plurality of straight lines, and the plurality of straight lines are spaced from and parallel with each other.

14. The method of claim 1, wherein the thickness of the precoat layer coated on the outer surface of each of the plurality of carbon nanotubes is 5 nanometers.

15. A method of making nanostructures, the method comprising:
suspending a carbon nanotube structure, wherein the carbon nanotube structure comprises a plurality of carbon nanotubes orderly aligned;
forming a carbon nanotube composite structure by applying a first precoat layer and a second precoat layer on the carbon nanotube structure in that sequence, wherein a total thickness of the first precoat layer and the second precoat layer on outer surface of each of plurality of carbon nanotubes ranges from 2 nanometers to 10 nanometers;
transferring the carbon nanotube composite structure on a surface of a substrate and treating the carbon nanotube composite structure with a solution by applying the solution on the carbon nanotube composite structure and evaporating the solution on the carbon nanotube composite structure so that the carbon nanotube composite structure is attached on the surface of the substrate;
removing the carbon nanotube structure by annealing the carbon nanotube composite structure in an annealing temperature from 500° C. to 700° C., wherein both the first precoat layer and the second precoat layer are softened and contracted to form a plurality of nanostructures integrated with the substrate to form an integrated structure via van der Waals force.

16. The method of claim 15, wherein the first precoat layer is directly coated on the carbon nanotube structure, and the second precoat layer is coated on the first precoat layer.

17. The method of claim 15, wherein a material of the first precoat layer is different from a material of the second precoat layer.

18. The method of claim 17, wherein the first precoat layer is silver with a thickness of 2 nanometers, and the second precoat layer is silicon with a thickness of 2 nanometers.

19. The method of claim 15, wherein the first precoat layer and the second precoat layer are softened and contracted to form a plurality of spherical particles, and each of the plurality of spherical particles comprises a core and a shell coated on the core.

20. The method of claim 19, wherein the first precoat layer is softened and contracted to form the core, and the second precoat layer is softened and contracted to form the shell.

* * * * *